United States Patent
Goto

(10) Patent No.: US 8,729,639 B2
(45) Date of Patent: May 20, 2014

(54) SEMICONDUCTOR DEVICE AND METHOD FOR PRODUCING THE SAME

(71) Applicant: Kabushiki Kaisha Toshiba, Tokyo (JP)

(72) Inventor: Masakazu Goto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/760,806

(22) Filed: Feb. 6, 2013

(65) Prior Publication Data

US 2014/0084388 A1    Mar. 27, 2014

(30) Foreign Application Priority Data

Sep. 27, 2012    (JP) .................................. 2012-213834

(51) Int. Cl.
*H01L 21/336*    (2006.01)
*H01L 21/8238*    (2006.01)
*H01L 21/8234*    (2006.01)

(52) U.S. Cl.
CPC .... *H01L 21/823842* (2013.01); *H01L 21/8238* (2013.01); *H01L 21/8234* (2013.01)
USPC .... 257/369; 257/377; 257/410; 257/E27.046; 257/E27.108; 257/E21.632

(58) Field of Classification Search
CPC .............. H01L 21/336; H01L 21/8234; H01L 21/8238; H01L 21/823842
USPC .......... 257/369–392, 408, 410, 461, E21.409, 257/632, 27.046, 64, 108
See application file for complete search history.

(56) References Cited

U.S. PATENT DOCUMENTS

| | | | |
|---|---|---|---|
| 5,177,568 A * | 1/1993 | Honma et al. ................ | 257/295 |
| 7,291,527 B2 * | 11/2007 | Chambers et al. ............ | 438/197 |
| 7,323,373 B2 * | 1/2008 | Mathew et al. ............... | 438/156 |
| 8,129,794 B2 * | 3/2012 | Hirase .......................... | 257/369 |

(Continued)

FOREIGN PATENT DOCUMENTS

| | | |
|---|---|---|
| JP | 2005-277223 A | 10/2005 |
| JP | 2011-066433 A | 3/2011 |
| JP | 2011-100986 A | 5/2011 |
| JP | 2011-181617 A | 9/2011 |

OTHER PUBLICATIONS

E. Cartier et al: "pFET $V_t$ control with $HfO_2$/TiN/poly-Si gate stack using a lateral oxygenation process": 2009 Symposium on VLSI Technology Digest of Technical Papers: Jun. 2009: pp. 42-43 (in English).

(Continued)

*Primary Examiner* — Michael Lebentritt
(74) *Attorney, Agent, or Firm* — Holtz Holtz Goodman & Chick PC

(57) ABSTRACT

According to one embodiment, a semiconductor device includes a gate electrode formed on a substrate with a gate insulation film interposed therebetween, and a source region of a first conductivity type and a drain region of a second conductivity type reverse to the first conductivity type, which are formed so as to hold the gate electrode therebetween within the substrate. The work function of a first region on the source region side within the gate electrode is shifted toward the first conductivity type as compared to the work function of a second region on the drain region side within the gate electrode.

13 Claims, 10 Drawing Sheets

(56) References Cited

U.S. PATENT DOCUMENTS

| | | | |
|---|---|---|---|
| 8,138,568 B2* | 3/2012 | Yoon et al. | 257/461 |
| 8,188,551 B2 | 5/2012 | Schulz et al. | |
| 8,299,530 B2* | 10/2012 | Pei et al. | 257/351 |
| 2002/0094640 A1* | 7/2002 | Forbes | 438/257 |
| 2005/0012087 A1* | 1/2005 | Sheu et al. | 257/14 |
| 2011/0079860 A1 | 4/2011 | Verhulst | |
| 2011/0210375 A1 | 9/2011 | Ikeda et al. | |
| 2011/0248350 A1* | 10/2011 | Chudzik et al. | 257/369 |
| 2012/0139057 A1* | 6/2012 | Goto | 257/392 |
| 2012/0199909 A1 | 8/2012 | Schulz et al. | |
| 2012/0248350 A1* | 10/2012 | Sakata et al. | 251/116 |
| 2013/0075830 A1* | 3/2013 | Miyano et al. | 257/408 |
| 2013/0137236 A1* | 5/2013 | Bhuwalka et al. | 438/305 |

OTHER PUBLICATIONS

W. Y. Choi et al: "Tunneling Field-Effect Transistors (TFETs) With Subthreshold Swing (SS) Less Than 60mV/dec": IEEE Electron Device Letters: vol. 28, No. 8: Aug. 2007: pp. 743-745 (in English).

K. Shiraishi et al: "Physics in Fermi Level Pinning at the PiolySi/Hf-based High-K Oxide Interface": 2004 Symposium on VLSI Technology Digest of Technical Papers: pp. 108-109 (in English).

A. Villalon et al: "Strained Tunnel FETs with record ION: First demonstration of ETSOI TFETs with SiGe channel and RSD": 2012 Symposium on VLSI Technology Digest of Technical Papers: pp. 49-50 (in English).

* cited by examiner

SEMICONDUCTOR DEVICE AND METHOD FOR PRODUCING THE SAME

CROSS REFERENCE TO RELATED APPLICATION

This application is based upon and claims benefit of priority from the Japanese Patent Application No. 2012-213834, filed on Sep. 27, 2012, the entire contents of which are incorporated herein by reference.

FIELD

Embodiments described herein relate generally to a semiconductor device and a method for producing the same.

BACKGROUND

In recent years, tunnel field effect transistors with low power consumption (TFET, hereinafter referred to as "tunnel transistors") have been proposed. In the tunnel transistor, a slope of a drain current to a gate voltage in a sub-threshold region (sub-threshold slope) can exceed a theoretical limit value of a slope in a MOSFET.

However, the tunnel transistor has such a problem that there is a large difference between the work function of a source diffusion layer and the work function of a gate electrode, so that a redundant electric field occurs in a gate insulation film in the upper part of the source, and a leakage current is easily generated between the source and the gate.

DETAILED DESCRIPTION

According to one embodiment, a semiconductor device includes a gate electrode formed on a substrate with a gate insulation film interposed therebetween, and a source region of a first conductivity type and a drain region of a second conductivity type reverse to the first conductivity type, which are formed so as to hold the gate electrode therebetween within the substrate. The work function of a first region on the source region side within the gate electrode is shifted toward the first conductivity type as compared to the work function of a second region on the drain region side within the gate electrode.

Embodiments will now be explained with reference to the accompanying drawings.

First Embodiment

Figure 1:
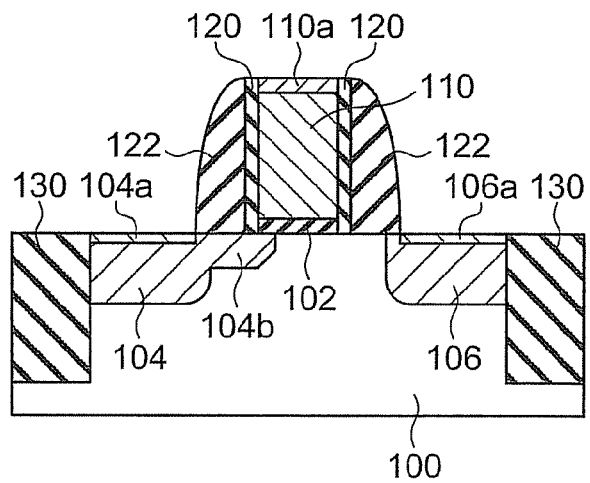
FIG. 1 is a sectional view of a semiconductor device according to a first embodiment.

FIG. 1 is a sectional view of a semiconductor device according to a first embodiment. The semiconductor device is a P-type tunnel transistor including a gate insulation film 102 formed on a semiconductor substrate 100, a gate electrode 110 formed on the gate insulation film 102, and an N-type source region 104 and a P-type drain region 106 that are formed within the semiconductor substrate 100 so as to hold the gate electrode 110 therebetween. The semiconductor substrate 100 is, for example, a silicon substrate. The gate insulation film 102 is, for example, a silicon oxide film.

The p-type tunnel transistor is electrically isolated from an adjacent tunnel transistor (not shown) by an element isolation region 130. The element isolation region 130 has, for example, a STI (Shallow Trench Isolation) structure, and is formed of silicon oxide.

Second side wall insulation films 122 are formed at both side wall portions of the gate electrode 110 with first side wall insulation films (offset spacers) 120 interposed therebetween. The first side wall insulation film 120 is, for example, a silicon nitride film. The second side wall insulation film 122 is, for example, a silicon oxide film.

As shown in FIG. 1, between the source region 104 and the drain region 106, an N-type source extension region 104b is formed so as to be adjacent to the source region 104. The source extension region 104b extends to below the end portion of the gate electrode 110. In this embodiment, no drain extension region is formed for reducing a tunnel off-leakage current at the drain region 106.

Silicide layers 104a, 106a and 110a are formed at the upper surface portions of the source region 104, the drain region 106 and the gate electrode 110, respectively. Silicide layers 104a, 106a and 110a are, for example, NiSi (nickel silicide) layers and CoSi (cobalt silicide) layers.

The gate electrode 110 contains polysilicon and has a work function of about 5.0 eV or less. Generally, a P-type polar gate electrode has a work function of about 5.2 eV, and an N-type polar gate electrode has a work function of about 4.1 eV. The gate electrode 110 may be an N-type polysilicon gate electrode, or one formed by introducing an N-type impurity into a P-type polysilicon gate electrode, or a polysilicon gate electrode in which the introduction amount of a P-type impurity is reduced.

Figures 2A, 2B:
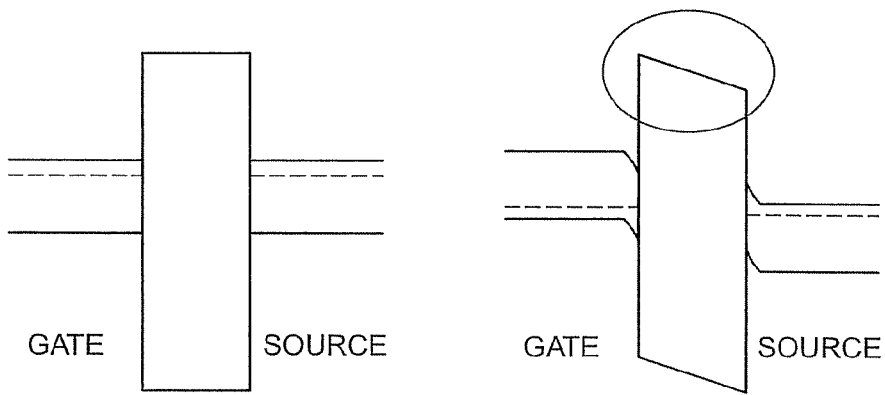
FIGS. 2A and 2B are each a view of an energy band diagram between a gate electrode and a source region.

FIG. 2A is a view of an energy band diagram between the gate electrode 110 and the source region 104 (source extension region 104b) at off state (when the gate voltage is 0) when the gate electrode 110 is an N-type polysilicon gate electrode. FIG. 2B, which shows Comparative Example, is a view of an energy band diagram between the gate electrode and the N-type source region (source extension region) at off state (when the gate voltage is 0) when the gate electrode is a P-type polysilicon gate electrode (work function: about 5.2 eV).

It is apparent from FIG. 2B that when the gate electrode is a P-type polysilicon gate electrode, there is a large difference between the work functions of the P-type polysilicon gate electrode and the N-type source extension region, so that an electric field occurs in the gate insulation film even when the gate voltage is 0. This may cause a gate leakage current.

On the other hand, according to this embodiment, the work function of the gate electrode 110 is shifted toward the N-type side as compared to the work function of the gate electrode formed of P-type polysilicon, and therefore as shown in FIG. 2A, the difference between the work functions of the gate electrode 110 and the N-type source extension region 104b is small, so that the electric field applied to the gate insulation film 102 located on the source extension region 104b is lessened, and the gate leakage current can be reduced.

A method for producing a semiconductor device according to this embodiment will now be described with reference to FIGS. 3A to 3I.

Figure 3A:
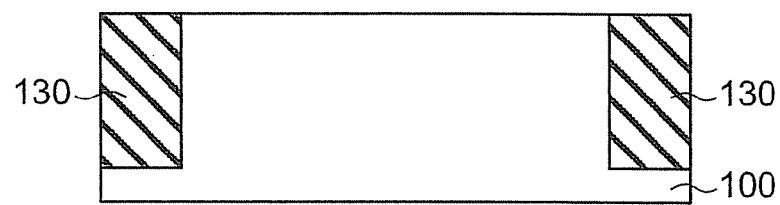
FIGS. 3A to 3I are each a process sectional view for explaining a method for producing a semiconductor device according to the first embodiment.

First, as shown in FIG. 3A, element isolation regions 130 of STI structure are formed within the semiconductor substrate 100 using a known method.

Figure 3B:
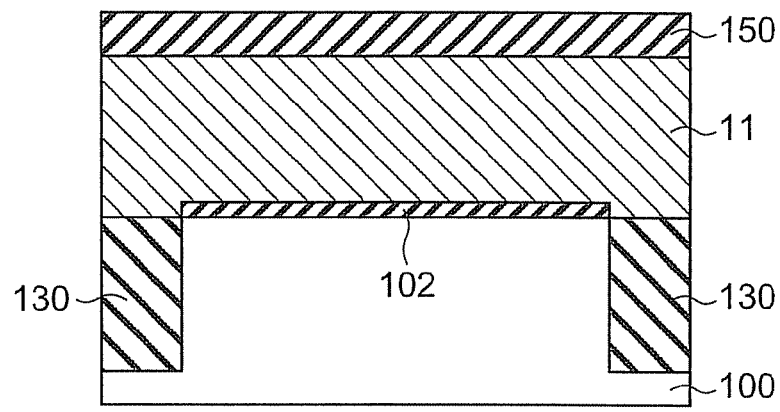

Next, as shown in FIG. 3B, a silicon oxide film that forms the gate insulation film 102 is formed on the semiconductor substrate 100 between element isolation regions 130 by a thermal oxidation method. Subsequently, an electrode material 11 for the gate electrode 110 is deposited on the semiconductor substrate 100 by CVD (Chemical Vapor Deposition). The electrode material 11 is, for example, polysilicon.

Subsequently, an N-type impurity is introduced into the electrode material 11 by, for example, an ion implantation method. At this time, for example, P (phosphorus) is used as ion species. An N-type impurity and a P-type impurity may be introduced into the electrode material 11.

Subsequently, a gate hard mask material 150 is deposited on the entire surface of the electrode material 11 by CVD. The gate hard mask material 150 is, for example, SIN.

Figure 3C:
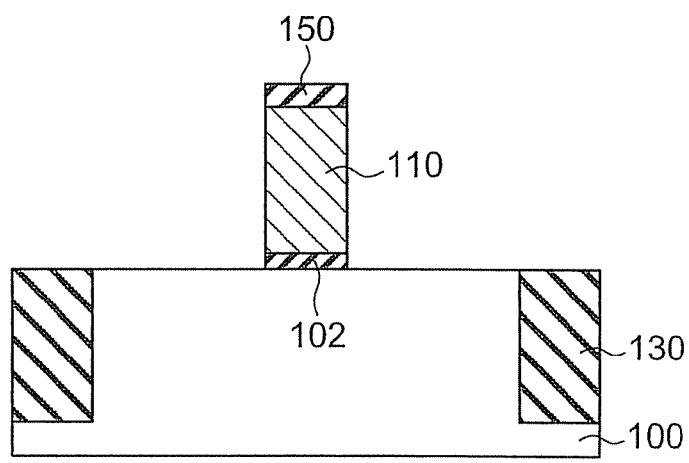

Next, as shown in FIG. 3C, the gate hard mask material 150 is processed by lithography and RIE (Reactive Ion Etching), and the electrode material 11 is processed using the gate hard mask material 150 as a mask to form the gate electrode 110. Consequently, the N conductivity-type gate electrode 110 is formed.

Figure 3D:
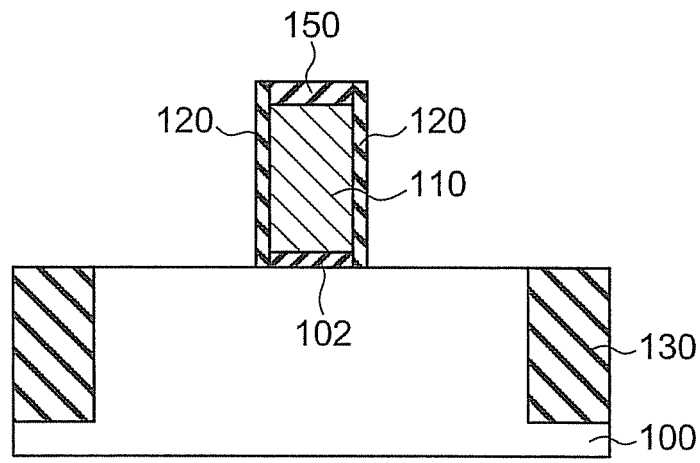

Next, as shown in FIG. 3D, first side wall insulation films 120 are formed on both side surfaces of the gate electrode 110. The first side wall insulation film 120 is formed by, for example, depositing a silicon nitride film for the first side wall insulation film 120 on the entire surface of the semiconductor substrate 100 by CVD, and anisotropically etching the silicon nitride film by RIE. The thickness of the first side wall insulation film 120 is, for example, 5 nm.

Figure 3E:
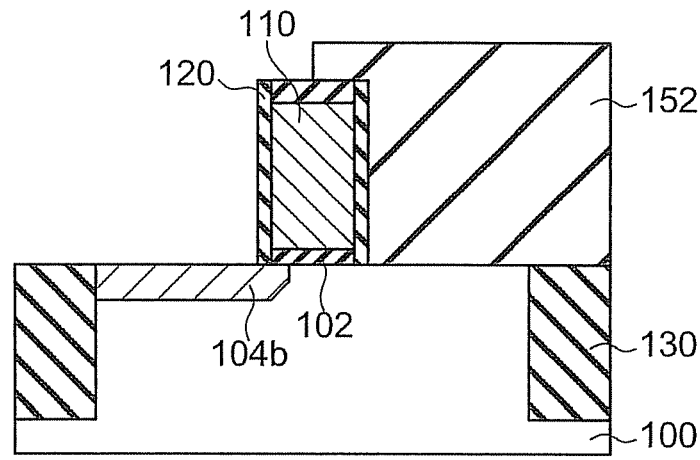

Next, as shown in FIG. 3E, a resist film 152 is applied, and a portion corresponding to a source region is opened by a lithography treatment. At this time, the portion corresponding to the drain region is covered with the resist film 152. Subsequently, ion implantation are carried out using the resist film 152 as a mask to form the source extension region 104b. In the ion implantation, for example, As (arsenic) is used as ion species.

Figure 3F:
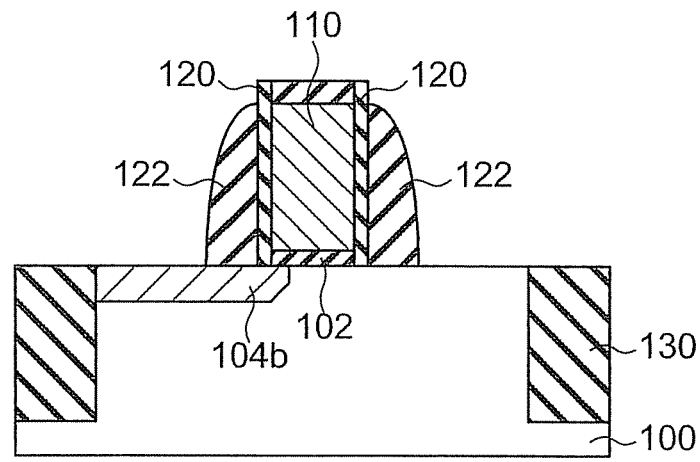

Next, as shown in FIG. 3F, second side wall insulation films 122 are formed at both side portions of the gate electrode 110 with first side wall insulation films 120 interposed therebetween after removing the resist film 152. The second side wall insulation film 122 is formed by, for example, depositing a silicon oxide film for the second side wall insulation film 122 on the entire surface of the semiconductor substrate 100 by CVD, and anisotropically etching the silicon oxide film by RIE. The thickness of the second side wall insulation film is, for example, 30 nm.

Figure 3G:
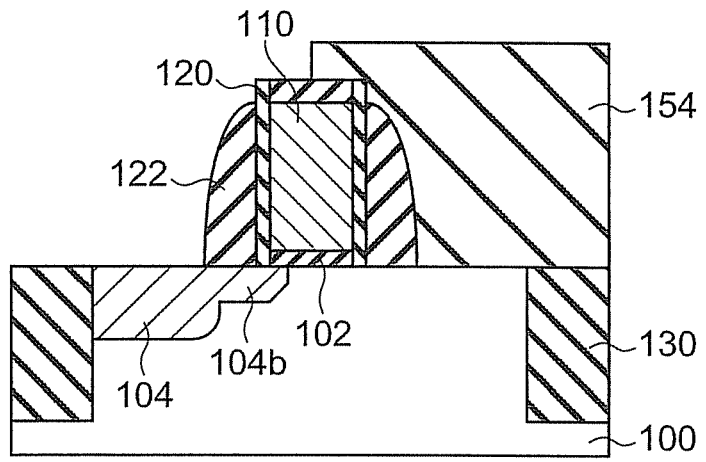

Next, as shown in FIG. 3G, a resist film 154 is applied, and a portion corresponding to a source region is opened by a lithography treatment. At this time, the portion corresponding to the drain region is covered with the resist film 154. Then, ion implantation is carried out using the resist film 154 as a mask to form the source region 104. In the ion implantation, for example, As (arsenic) is used as ion species.

Figure 3H:
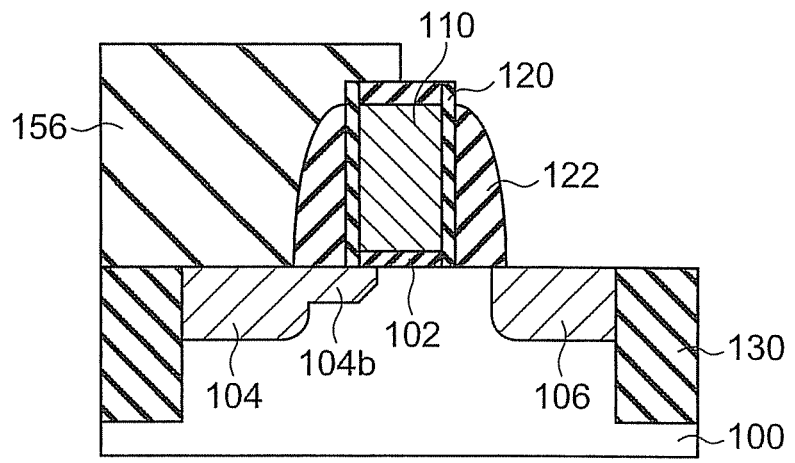

Next, as shown in FIG. 3H, a resist film 156 is applied, and the portion corresponding to the drain region is opened by a lithography treatment after removing the resist film 154. At this time, the source region 104 is covered with the resist film 156. Then, ion implantation is carried out using the resist film 156 as a mask to form the drain region 106. In the ion implantation, for example, B (boron) is used as ion species.

Figure 3I:
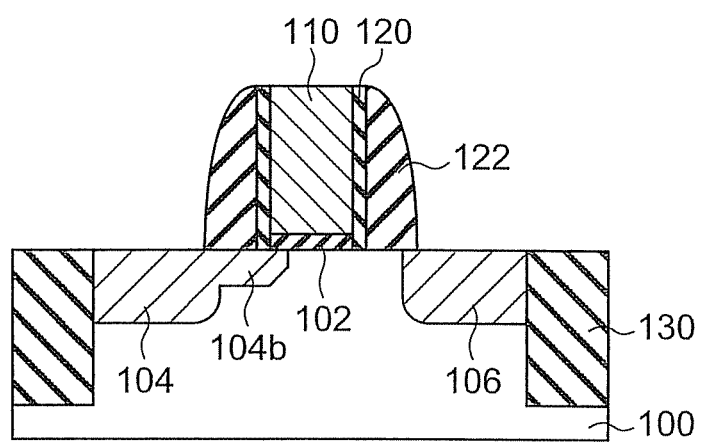

Next, as shown in FIG. 3I, the gate hard mask material 150 is removed by, for example, hot phosphoric acid after removing the resist film 156.

Thereafter, for example, spike annealing is performed in an annealing step for activating impurities. Then, suicide layers 104a, 106a and 110a are formed in a self-aligned manner by a salicide step. In this way, a P-type tunnel transistor is produced in which the work function of the gate electrode 110 is shifted toward the N-type side as compared to the work function of the gate electrode formed of P-type polysilicon as shown in FIG. 1.

According to this embodiment, the gate electrode 110 of the P-type tunnel transistor has a work function close to that of the N-type, so that the electric field applied to the gate insulation film 102 located on the source extension region 104b is lessened, and the gate leakage current can be reduced.

Second Embodiment

Figure 4:
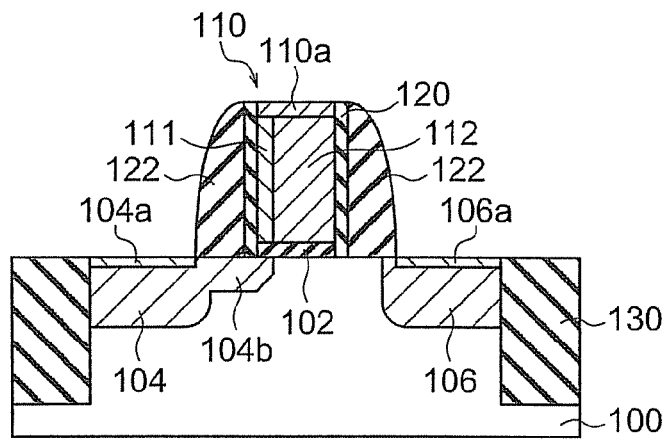
FIG. 4 is a sectional view of a semiconductor device according to a second embodiment.

FIG. 4 is a sectional view of a semiconductor device according to a second embodiment. This embodiment is different in the configuration of a gate electrode 110 from the first embodiment shown in FIG. 1. In FIG. 4, same parts as in the first embodiment shown in FIG. 1 are given same symbols, and descriptions thereof are omitted.

As shown in FIG. 4, the gate electrode 110 has a first region 111 located on the source region 104 side and having a low work function, and a second region 112 located on the drain region side and having a high work function. The first region 111 is located above a source extension region 104b, and contains an N-type impurity. The second region 112 contains a P-type impurity.

The first region 111 contains an N-type impurity, and has a small difference in work function between itself and the N-type source extension region 104b. Therefore, the electric field applied to a gate insulation film 102 located on the source extension region 104b is lessened, and the gate leakage current can be reduced.

Since the second region 112 has a work function comparable to that of the gate electrode formed of P-type polysilicon, the threshold voltage of the tunnel transistor can be kept low as compared to the first embodiment described above.

A method for producing a semiconductor device according to this embodiment will now be described. Here, matters different from the first embodiment are described.

Steps up to and including a step of forming the second side wall insulation film 122 are same as those in the first embodiment described above (see FIGS. 3A to 3F) except that introduction of an impurity into the electrode material 11 and formation of the gate hard mask material 150 are omitted, and therefore descriptions thereof are omitted.

Figure 5A:
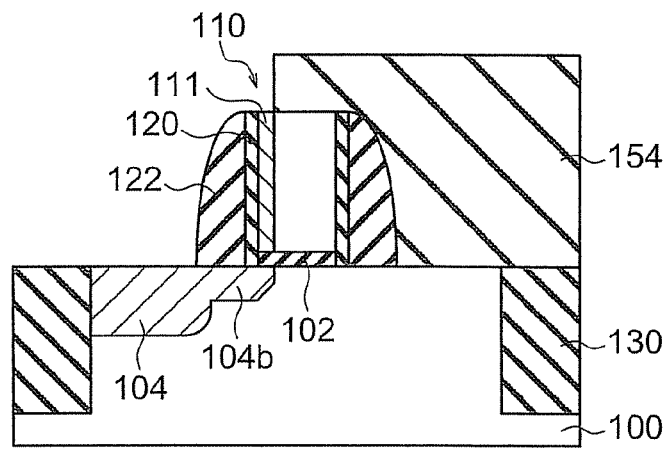
FIGS. 5A and 5B are each a process sectional view for explaining a method for producing a semiconductor device according to the second embodiment.

After forming the second side wall insulation film 122, a resist film 154 is applied, and a portion corresponding to the source region and a portion corresponding to the first region 111 of the gate electrode 110 are opened by a lithography treatment as shown in FIG. 5A. At this time, the portion corresponding to the drain region and the portion corresponding to the second region 112 of the gate electrode 110 are covered with the resist film 152. Subsequently, ion implantation is carried out using the resist film 152 as a mask to form the source region 104 and the first region 111. In the ion implantation, for example, As (arsenic) is used as ion species.

Figure 5B:
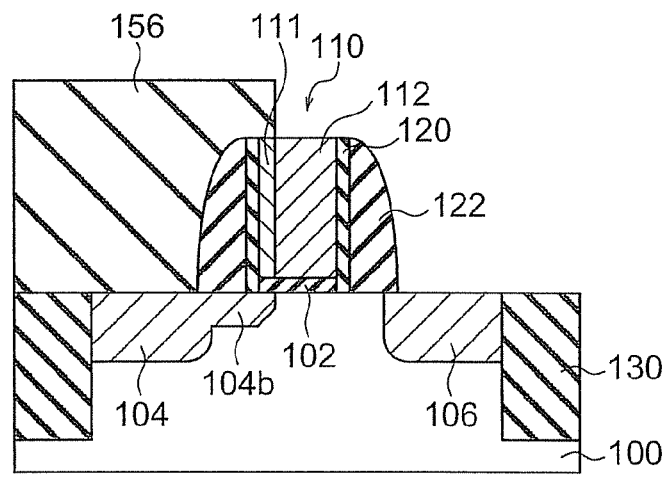

Next, as shown in FIG. 5B, a resist film 156 is applied, and the portion corresponding to the drain region and the portion corresponding to the second region 112 of the gate electrode 110 are opened by a lithography treatment after removing the resist film 154. At this time, the source region 104 and the first region 111 of the gate electrode 110 are covered with the resist film 156. Then, ion implantation is carried out using the resist film 156 as a mask to form the drain region 106 and the second region 112. In the ion implantation, for example, B (boron) is used as ion species.

Subsequent steps are same as those in the first embodiment described above, and therefore descriptions thereof are omitted.

In this way, a P-type tunnel transistor is produced in which the work function of the first region 111 located on the source region 104 side in the gate electrode 110 is shifted toward the N-type side as compared to the work function of the gate electrode formed of P-type polysilicon as shown in FIG. 4.

According to this embodiment, the first region 111 located on the source region 104 side of the gate electrode 110 of the P-type tunnel transistor has a work function close to that of the N-type, so that the electric field applied to the gate insulation film 102 located on the source extension region 104b is lessened, and the gate leakage current can be reduced. Since the second region 112 located on the drain region 106 side of the gate electrode 110 has a work function comparable to that of the gate electrode formed of P-type polysilicon, the threshold of the tunnel transistor can be kept low.

Third Embodiment

Figure 6:
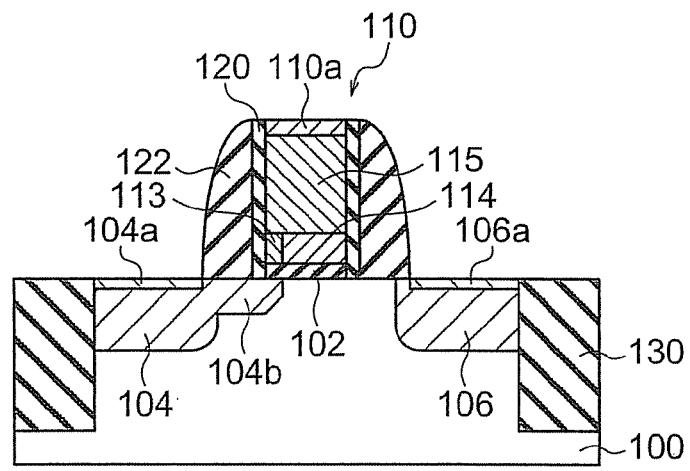
FIG. 6 is a sectional view of a semiconductor device according to a third embodiment.

FIG. 6 is a sectional view of a semiconductor device according to a third embodiment. This embodiment is different in the configuration of a gate electrode 110 from the first embodiment shown in FIG. 1. In FIG. 6, same parts as in the first embodiment shown in FIG. 1 are given same symbols, and descriptions thereof are omitted.

As shown in FIG. 6, the gate electrode 110 has a first metal film 113 located on the source region 104 side and having a low work function, a second metal film 114 located on the drain region 106 side and having a high work function, and a semiconductor layer 115 provided on the first metal film 113 and the second metal film 114. The first metal film 113 is located above a source extension region 104b, has a work function close to that of N-type silicon, and is, for example, an aluminum film. The second metal film 114 has a work function close to P-type silicon, and is, for example, a tungsten film. The semiconductor layer 115 is, for example, polysilicon.

The first metal film 113 has a small difference in work function between itself and the N-type source extension region 104b. Therefore, the electric field applied to a gate insulation film 102 located on the source extension region 104b is lessened, and the gate leakage current can be reduced.

Since the second metal film 114 has a work function comparable to that of the gate electrode formed of P-type polysilicon, the threshold of the tunnel transistor can be kept low as compared to the first embodiment described above.

In this embodiment, the work function of the gate electrode 110 can be determined not by ion implantation, but by the type of a metal film, and therefore a wider range of threshold voltages can be set.

A method for producing a semiconductor device according to this embodiment will now be described. Here, matters different from the first embodiment are described.

Figure 7A:
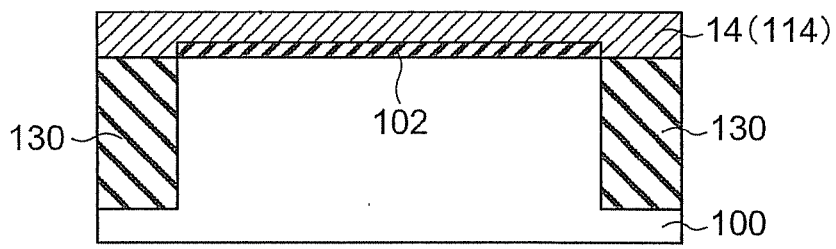
FIGS. 7A to 7E are each a process sectional view for explaining a method for producing a semiconductor device according to the third embodiment.

As shown in FIG. 7A, element isolation regions 130 are formed within a semiconductor substrate 100, a silicon oxide film that forms the gate insulation film 102 is formed on the semiconductor substrate 100 between element isolation regions 130 (see FIGS. 3A and 3B in the first embodiment described above), and thereafter a metal material 14 that forms the second metal film 114 is formed by a sputtering method.

Figure 7B:
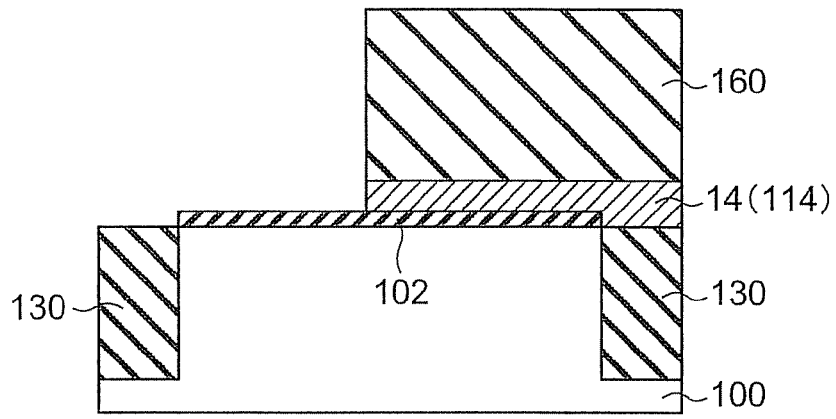

Next, as shown in FIG. 7B, a resist 160 is applied onto the metal material 14, and a portion corresponding to the source region and a portion corresponding to the first metal film 113 (see FIG. 6) are opened by a lithography treatment. At this time, the portion corresponding to the drain region and the portion corresponding to the second metal film 114 (see FIG. 6) are covered with the resist film 160. Subsequently, the metal material 14 is etched by a chemical liquid using the resist film 160 as a mask. When the metal material 14 is tungsten, for example, Fluonitric acid is used for the chemical liquid.

Figure 7C:
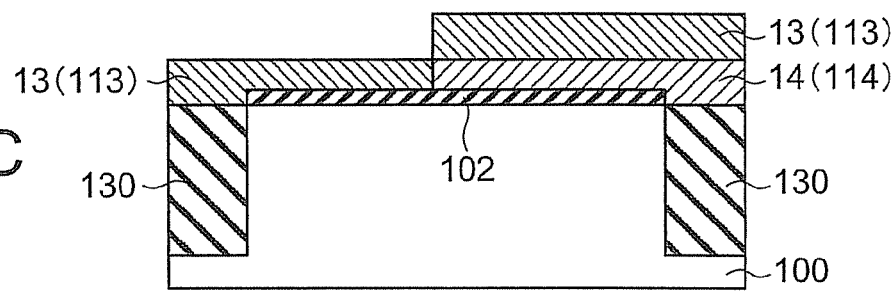

Next, as shown in FIG. 7C, a metal material 13 that forms the first metal film 113 is formed by a sputtering method after removing the resist 160.

Figure 7D:
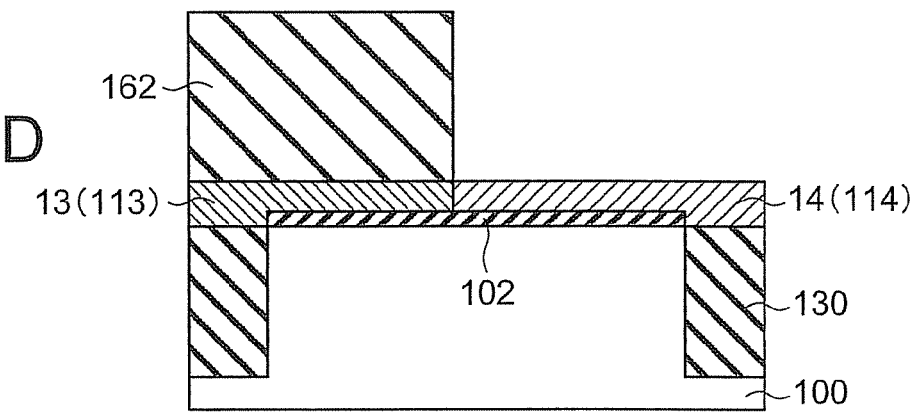

Next, as shown in FIG. 7D, a resist 162 is applied onto the metal material 13, and a portion corresponding to the drain region and a portion corresponding to the second metal film 114 (see FIG. 6) are opened by a lithography treatment. At this time, the portion corresponding to the source region and the portion corresponding to the first metal film 113 (see FIG. 6) are covered with the resist film 162. Subsequently, the metal material 13 is etched by a chemical liquid using the resist film 162 as a mask. When the metal material 13 is aluminum, for example, hot phosphoric acid is used for the chemical liquid.

Figure 7E:
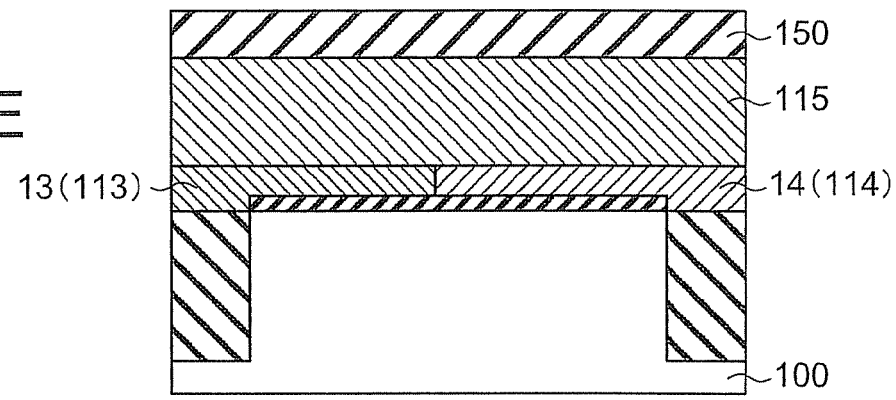

Next, as shown in FIG. 7E, the semiconductor layer 115 is formed on the metal material 13 and the metal material 14 by CVD. Further, a gate hard mask material 150 is deposited on the entire surface of the semiconductor layer 115 by CVD.

Subsequent steps are same as those in the first embodiment described above (see FIGS. 3C to 3F), and therefore descriptions thereof are omitted.

In this way, a P-type tunnel transistor is produced in which the work function of the first metal film 113 located on the source region 104 side in the gate electrode 110 is shifted toward the N-type side as compared to the work function of the gate electrode formed of P-type polysilicon as shown in FIG. 6.

According to this embodiment, the first metal film 113 located on the source region 104 side of the gate electrode 110 of the P-type tunnel transistor has a work function close to that of the N-type, so that the electric field applied to the gate insulation film 102 located on the source extension region 104b is lessened, and the gate leakage current can be reduced. Since the second metal film 114 located on the drain region 106 side of the gate electrode 110 has a work function comparable to that of the gate electrode formed of P-type polysilicon, the threshold of the tunnel transistor can be kept low. The work function of the gate electrode 110 can be determined not by ion implantation, but by the type of a metal film, and therefore a wider range of threshold voltages can be set.

In the third embodiment described above, etching of the metal material 13 may be omitted. The order in which the metal material 14 and the metal material 13 are formed may be reversed. The semiconductor layer 115 of the gate electrode 110 may be omitted.

Fourth Embodiment

Figure 8:
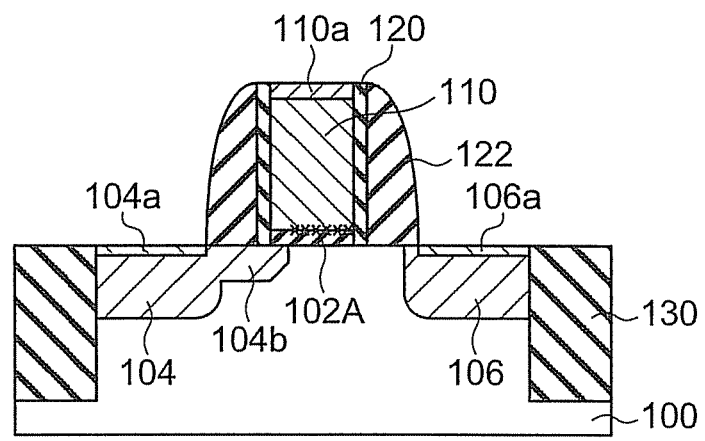
FIG. 8 is a sectional view of a semiconductor device according to a fourth embodiment.
Figure 9:
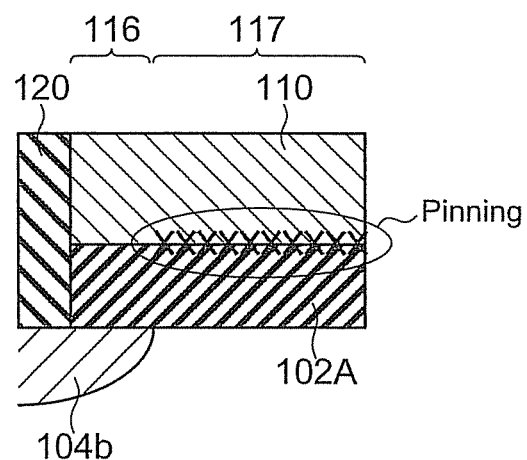
FIG. 9 is a sectional view of a semiconductor device according to a fourth embodiment.

FIG. 8 is a sectional view of a semiconductor device according to a fourth embodiment. FIG. 9 is an enlarged view of an interface portion between a gate insulation film and a gate electrode in the semiconductor device according to this embodiment. This embodiment is different in the material of the gate insulation film from the first embodiment shown in FIG. 1. In FIG. 8, same parts as in the first embodiment shown in FIG. 1 are given same symbols, and descriptions thereof are omitted.

In this embodiment, the gate insulation film 102A is a high-dielectric constant gate insulation film. The high-dielectric constant gate insulation film is made of a material having a dielectric constant higher than that of a silicon oxide film, and for example, HfO2 (hafnia), ZrO2 (zirconia), a silicate thereof (HfSiOx or ZrSiOx), an aluminate thereof (HfAlOx or ZrAlOx), or a nitride thereof (HfSiON or ZrSiON) is used.

In this embodiment, the work function is close to that of P-type silicon due to fermi level pinning at the interface between the high-dielectric constant gate insulation film 102A and the gate electrode 110 in a second region 117 on the drain region 106 side of the gate electrode 110 as shown in FIG. 9. On the other hand, in a first region 116 on the source region 104 side of the gate electrode 110, fermi level pinning at the interface between the high-dielectric constant gate insulation film 102A and the gate electrode 110 does not occur, and the work function is shifted toward the N-type side as compared to the second region 117.

A high-dielectric constant material formed from an ionic bond has a weak bond between oxygen and other element as compared to a material formed from a covalent bond, such as a silicon oxide film. Therefore, in the high-dielectric constant gate insulation film, a bond between oxygen and other element is easily broken during a semiconductor production process to cause oxygen deficiency. Oxygen deficiency of the gate insulation film causes the work function of the gate electrode to be pinned to near the middle gap of Si. By utilizing such a phenomenon, the work function of N-type Si is shifted toward the P-type in the second region 117 on the drain region 106 side of the gate electrode 110.

In the high-dielectric constant gate insulation film 102A, the oxygen deficiency level on the first region 116 side is made lower than the oxygen deficiency level on the second region 117 side to suppress pinning of the work function on the first region 116 side. Thus, the work function of the first region 116 is shifted toward the N-type side as compared to the work function of the second region 117, the difference in the work function between itself and an N-type source extension region 104b is small, and an electric field applied to the high-dielectric constant gate insulation film 102A located on the source extension region 104b is lessened, so that the gate leakage current can be reduced.

Since the second region 117 has a work function close to that of P-type Si, the threshold of the tunnel transistor can be kept low as compared to the first embodiment described above.

A method for producing a semiconductor device according to this embodiment will now be described. Here, matters different from the first embodiment are described.

Figure 10A:
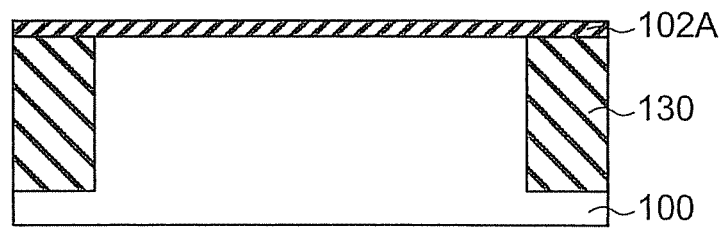
FIGS. 10A to 10D are each a process sectional view for explaining a method for producing a semiconductor device according to the fourth embodiment.

First, as shown in FIG. 10A, element isolation regions 130 are formed within a semiconductor substrate 100 (FIG. 3A in the first embodiment described above), and thereafter a high-dielectric constant material that forms the high-dielectric constant insulation film 102A is formed by CVD.

Figure 10B:
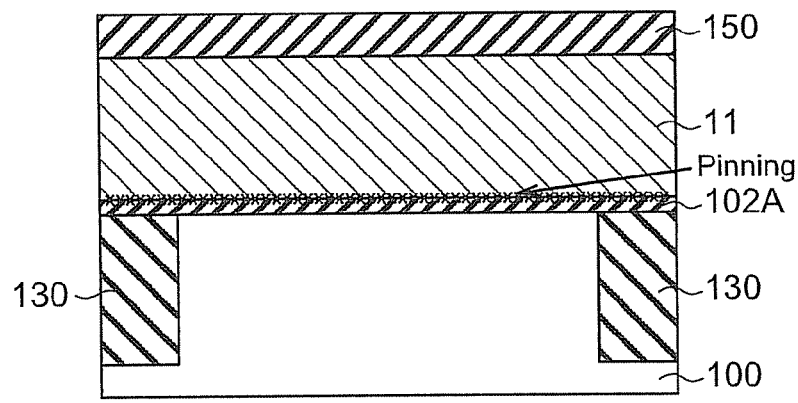

Next, an electrode material 11 for the gate electrode 110 is deposited on the semiconductor substrate 100 by CVD as shown in FIG. 10B. The electrode material 11 is, for example, polysilicon.

Subsequently, an N-type impurity is introduced into the electrode material 11 by, for example, an ion implantation method. At this time, for example, P (phosphorus) is used as ion species. An N-type impurity and a P-type impurity may be introduced into the electrode material 11.

In the high-dielectric constant gate insulation film 102A, oxygen deficiency occurs, and pinning spontaneously occurs at the interface between the high-dielectric constant gate insulation film 102A and the electrode material 11. Consequently, the work function of the electrode material 11 that is N-type Si is shifted toward the P-type.

Subsequently, a gate hard mask material 150 is deposited on the entire surface of the electrode material 11 by CVD. The gate hard mask material 150 is, for example, SiN.

Figure 10C:
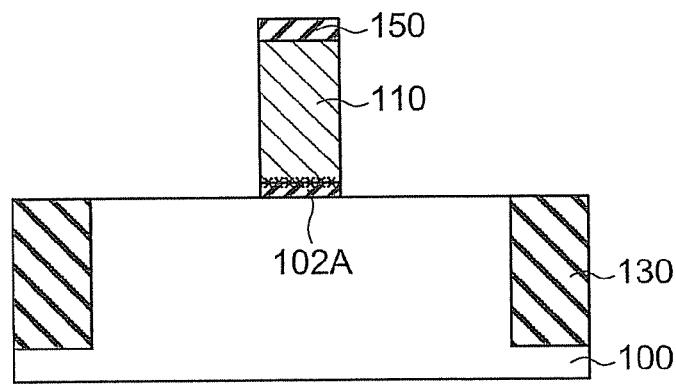

Next, as shown in FIG. 10C, the gate hard mask material 150 is processed by lithography and RIE, and the electrode material 11 and the high-dielectric constant gate insulation film 102A are processed using the gate hard mask material 150 as a mask to form the gate electrode 110.

Figure 10D:
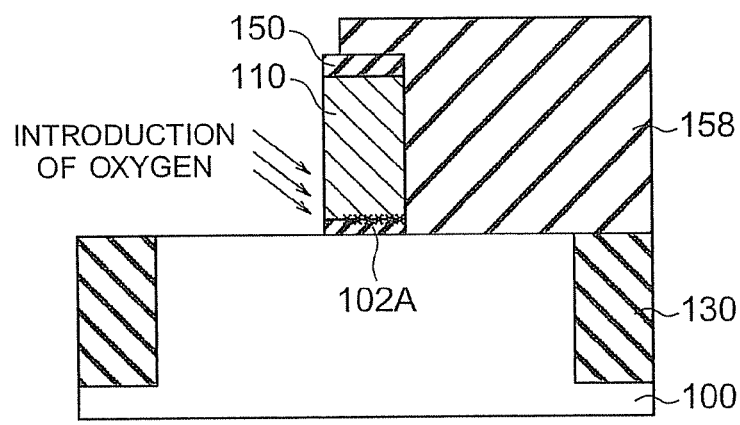

Next, as shown in FIG. 10D, a resist film 158 is applied, and a portion on the source region side is opened by a lithography treatment. At this time, the portion on the drain region side is covered with the resist film 158. Subsequently, oxygen is introduced into the gate electrode 110 and the high-dielectric constant gate insulation film 102A only on the source region side by an oxygen asher treatment or the like using the resist film 158 as a mask. The oxygen concentration in the high-dielectric constant gate insulation film 102A on the source region side is preferably higher than the oxygen concentration on the drain region side by 1% or more. By an oxygen introduction treatment, the high-dielectric constant gate insulation film 102A on the source region side is replenished with oxygen, so that pinning is suppressed to achieve a work function close to that of the N-type in the first region 116 on the source region side.

In the step shown in FIG. 10D, hard mask process using a silicon oxide film or the like may be used for avoiding consumption of the resist film 158 by the oxygen introduction treatment.

Subsequent steps are same as those in the first embodiment described above (see FIGS. 3C to 3I), and therefore descriptions thereof are omitted.

In this way, a P-type tunnel transistor is produced in which the work function of the first region 116 located on the source region 104 side in the gate electrode 110 is shifted toward the N-type side as compared to the work function of the gate electrode formed of P-type polysilicon as shown in FIG. 8.

According to this embodiment, the first region 116 located on the source region 104 side of the gate electrode 110 of the P-type tunnel transistor has a work function close to that of the N-type, so that the electric field applied to the high-dielectric constant gate insulation film 102A located on the source extension region 104b is lessened, and the gate leakage current can be reduced. Since the second region 117 located on the drain region 106 side of the gate electrode 110 has a work function close to that of the P-type due to pinning, the threshold of the tunnel transistor can be kept low. Since the work function of the gate electrode 110 can be controlled not by ion injection implantation, but by the material of the high-dielectric constant gate insulation film 102A and the oxygen introduction treatment, a wider range of threshold voltages can be set.

Figure 11:
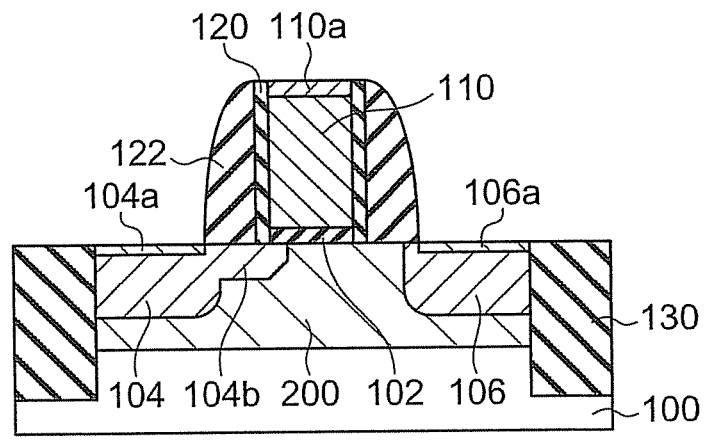
FIG. 11 is a sectional view of a semiconductor device according to a variant.
Figures 12A, 12B:
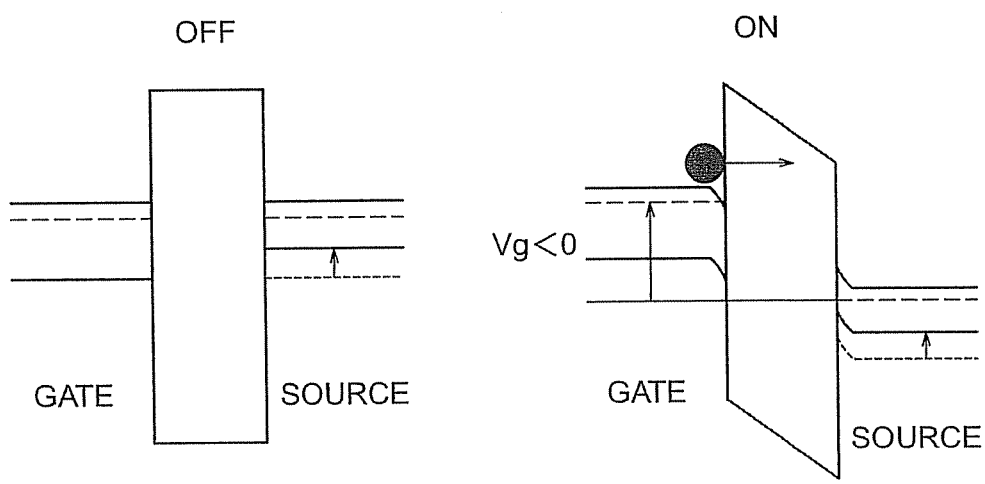
FIGS. 12A and 12B are each a view of an energy band diagram between a gate electrode and a source region.

In the first to fourth embodiments described above, a material, in which the valence band top is shifted toward the high energy side as compared to Si, such as SiGe, may be provided on the surface portion of the substrate 100. For example, SiGe is epitaxially grown on a silicon substrate. FIG. 11 shows a semiconductor device according to the first embodiment, to which the above-mentioned configuration is applied, and a SiGe layer 200 is formed on the surface portion of the substrate 100. FIGS. 12A and 12B are views of an energy band diagram between the gate electrode 110 and the source region 104 (source extension region 104b) at off time and on time, respectively, for the tunnel transistor shown in FIG. 11. As shown in FIG. 12, the electric field applied to the gate insulation film during operation of the transistor is not promoted even if the position of the valence band top on the substrate side is shifted toward the high energy side. Therefore, by forming the SiGe layer 200 on the surface portion of the substrate 100, the threshold voltage can be lowered while reducing the gate leakage current.

In the first to fourth embodiments described above, the P-type tunnel transistor has been described, but the N-type tunnel transistor may be used. In this case, the source region and the source extension region are of the P-type, and the drain region is of the N-type. The polarity of the gate electrode is also reversed in terms of N- and P-types. For example, when the N-type transistor is applied to the configuration of the first embodiment described above, the work function of the gate electrode is preferably 4.3 eV or more.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
   a gate electrode formed on a substrate with a gate insulation film interposed therebetween; and
   a source region of a first conductivity type and a drain region of a second conductivity type reverse to the first conductivity type, which are formed so as to hold the gate electrode therebetween within the substrate,
   wherein the work function of a first region on the source region side within the gate electrode is shifted toward the first conductivity type as compared to the work function of a second region on the drain region side within the gate electrode.

2. The semiconductor device according to claim 1, wherein the gate insulation film is a high-dielectric constant gate insulation film, and the oxygen concentration of the gate insulation film on the first region side is higher than the oxygen concentration of the gate insulation film on the second region side.

3. The semiconductor device according to claim 2, wherein a source extension region of the first conductivity type is formed so as to be adjacent to the source region between the source region and the drain region, and the first region is located above the source extension region.

4. The semiconductor device according to claim 3, wherein a surface portion of the substrate located below the gate electrode has the valence band top shifted toward the high energy side as compared to silicon.

5. The semiconductor device according to claim 1, wherein the first region has a first metal film in contact with the gate insulation film, and the second region has a second metal film that is in contact with the gate insulation film and different from the first metal film.

6. The semiconductor device according to claim 5, wherein a source extension region of the first conductivity type is formed so as to be adjacent to the source region between the source region and the drain region, and the first metal film is located above the source extension region.

7. The semiconductor device according to claim 6, wherein a surface portion of the substrate located below the gate electrode has the valence band top shifted toward the high energy side as compared to silicon.

8. The semiconductor device according to claim 1, wherein the first region of the gate electrode contains an impurity of the first conductivity type, and the second region of the gate electrode contains an impurity of the second conductivity type.

9. The semiconductor device according to claim 8, wherein a source extension region of the first conductivity type is formed so as to be adjacent to the source region between the source region and the drain region, and the first region is located above the source extension region.

10. The semiconductor device according to claim 9, wherein
   a surface portion of the substrate located below the gate electrode has the valence band top shifted toward the high energy side as compared to silicon.

11. A semiconductor device comprising:
   a gate electrode formed on a substrate with a gate insulation film interposed therebetween; and
   an N-type source region and a P-type drain region formed so as to hold the gate electrode therebetween within the substrate,
   wherein the work function of the gate electrode is 5.0 eV or less.

12. The semiconductor device according to claim 11, wherein
   an N-type source extension region is formed so as to be adjacent to the source region between the source region and the drain region.

13. The semiconductor device according to claim 12, wherein
   a surface portion of the substrate located below the gate electrode has the valence band top shifted toward the high energy side as compared to silicon.

* * * * *